(12) United States Patent
McLaurin et al.

(10) Patent No.: US 9,117,944 B2
(45) Date of Patent: Aug. 25, 2015

(54) SEMICONDUCTOR LIGHT EMITTING DEVICES GROWN ON COMPOSITE SUBSTRATES

(75) Inventors: Melvin B. McLaurin, Mountain View, CA (US); Michael R. Krames, Los Altos, CA (US)

(73) Assignees: Koninklijke Philips N.V., Eindhoven (NL); Philips Lumileds Lighting Company LLC, San Jose, CA (US)

( * ) Notice: Subject to any disclaimer, the term of this patent is extended or adjusted under 35 U.S.C. 154(b) by 439 days.

(21) Appl. No.: 12/236,853

(22) Filed: Sep. 24, 2008

(65) Prior Publication Data

US 2010/0072489 A1 Mar. 25, 2010

(51) Int. Cl.

| | |
|---|---|
| H01L 33/00 | (2010.01) |
| H01L 27/15 | (2006.01) |
| H01L 33/62 | (2010.01) |
| H01L 33/08 | (2010.01) |
| H01L 33/12 | (2010.01) |
| H01L 33/38 | (2010.01) |
| H01L 33/42 | (2010.01) |
| H01L 33/50 | (2010.01) |

(52) U.S. Cl.
CPC ............ *H01L 33/0079* (2013.01); *H01L 33/62* (2013.01); *H01L 27/153* (2013.01); *H01L 33/007* (2013.01); *H01L 33/08* (2013.01); *H01L 33/12* (2013.01); *H01L 33/382* (2013.01); *H01L 33/385* (2013.01); *H01L 33/42* (2013.01); *H01L 33/505* (2013.01); *H01L 2224/24* (2013.01); *H01L 2933/0016* (2013.01)

(58) Field of Classification Search
CPC .............. H01L 33/0079; H01L 33/007; H01L 21/02458; H01L 27/153; H01L 33/08; H01L 33/12; H01L 33/382; H01L 33/385; H01L 33/42; H01L 33/505; H01L 33/62; H01L 2933/0016; H01L 2224/24
USPC ......... 257/E33.025, E33.023, 88, 94; 438/39, 438/41, 34, 22
See application file for complete search history.

(56) References Cited

U.S. PATENT DOCUMENTS 6,806,115 B2   10/2004  Koide et al.
7,285,801 B2 *  10/2007  Eliashevich et al. ............ 257/96
(Continued)

FOREIGN PATENT DOCUMENTS

| JP | 2004048067 A | 2/2004 |
|---|---|---|
| JP | 2007266589 A | 10/2007 |

(Continued)

OTHER PUBLICATIONS

WO2007/072871—Nakahara US 2009/0029499 English translation.*

(Continued)

*Primary Examiner* — Latanya N Crawford (57) ABSTRACT

A plurality of III-nitride semiconductor structures, each including a light emitting layer disposed between an n-type region and a p-type region, are grown on a composite substrate. The composite substrate includes a plurality of islands of III-nitride material connected to a host by a bonding layer. The plurality of III-nitride semiconductor structures are grown on the III-nitride islands. The composite substrate may be formed such that each island of III-nitride material is at least partially relaxed. As a result, the light emitting layer of each semiconductor structure has an a-lattice constant greater than 3.19 angstroms.

18 Claims, 4 Drawing Sheets

(56) References Cited

U.S. PATENT DOCUMENTS

| | | | |
|---|---|---|---|
| 7,361,938 B2 | 4/2008 | Mueller et al. | |
| 7,413,918 B2 | 8/2008 | Tran et al. | |
| 7,525,248 B1* | 4/2009 | Fan | 313/512 |
| 7,800,120 B2 | 9/2010 | Furukawa et al. | |
| 7,888,779 B2 | 2/2011 | Jiang et al. | |
| 2005/0269582 A1* | 12/2005 | Mueller et al. | 257/94 |
| 2005/0274970 A1* | 12/2005 | Ludowise | 257/99 |
| 2006/0063288 A1* | 3/2006 | Liu | 438/22 |
| 2006/0154392 A1* | 7/2006 | Tran et al. | 438/22 |
| 2006/0284187 A1* | 12/2006 | Wierer et al. | 257/79 |
| 2007/0032041 A1* | 2/2007 | Lester et al. | 438/455 |
| 2007/0069225 A1* | 3/2007 | Krames et al. | 257/94 |
| 2007/0072324 A1 | 3/2007 | Krames et al. | |
| 2007/0126017 A1* | 6/2007 | Krames et al. | 257/98 |
| 2008/0087902 A1* | 4/2008 | Lee et al. | 257/88 |
| 2008/0149961 A1* | 6/2008 | Grillot et al. | 257/99 |
| 2008/0157090 A1 | 7/2008 | Thomson et al. | |
| 2008/0164485 A1* | 7/2008 | Lee | 257/93 |
| 2008/0211416 A1* | 9/2008 | Negley et al. | 315/193 |
| 2008/0237622 A1* | 10/2008 | Choi et al. | 257/98 |
| 2008/0251796 A1* | 10/2008 | Lee et al. | 257/88 |
| 2009/0029499 A1* | 1/2009 | Nakahara | 438/46 |
| 2009/0045394 A1* | 2/2009 | Smeeton et al. | 257/13 |
| 2009/0085048 A1* | 4/2009 | Lee et al. | 257/89 |
| 2010/0308361 A1* | 12/2010 | Beeson et al. | 257/98 |

FOREIGN PATENT DOCUMENTS

| | | | | |
|---|---|---|---|---|
| WO | 2005008791 A1 | 1/2005 | | |
| WO | 2007001124 A1 | 1/2007 | | |
| WO | WO2007/072871 | * | 6/2007 | H01L 33/0095 |

OTHER PUBLICATIONS

International Search Report Attached. PCT/IB2009/054134.

* cited by examiner

SEMICONDUCTOR LIGHT EMITTING DEVICES GROWN ON COMPOSITE SUBSTRATES

DESCRIPTION OF RELATED ART

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Since native III-nitride substrates are generally expensive and not widely available, III-nitride devices are often grown on sapphire or SiC substrates. Such non-III-nitride substrates are less than optimal because they have different lattice constants than the III-nitride layers grown on them, which causes strain and crystal defects in the III-nitride device layers, which can cause poor performance and reliability problems.

SUMMARY

In accordance with embodiments of the invention, a plurality of III-nitride semiconductor structures, each comprising a light emitting layer disposed between an n-type region and a p-type region, are grown on a composite substrate. The composite substrate includes a plurality of islands of III-nitride material connected to a host by a bonding layer. The plurality of III-nitride semiconductor structures are grown on the III-nitride islands. The composite substrate may be formed such that each island of III-nitride material is at least partially relaxed. As a result, the light emitting layer of each semiconductor structure has an a-lattice constant greater than 3.19 angstroms, which may reduce strain in the device.

Individual III-nitride semiconductor structures may be electrically connected by a conductive material, for example formed on the semiconductor structures themselves or on a mount to which the III-nitride semiconductor structures are connected.

DETAILED DESCRIPTION

In accordance with embodiments of the invention, a III-nitride light emitting device includes a group of III-nitride structures separated by trenches. The structures may be electrically connected to form a high performance device. Such devices may be grown on composite substrates, where trenches are formed between islands of seed layer material, which trenches may improve the strain relief provided by the substrate.

Figure 1:
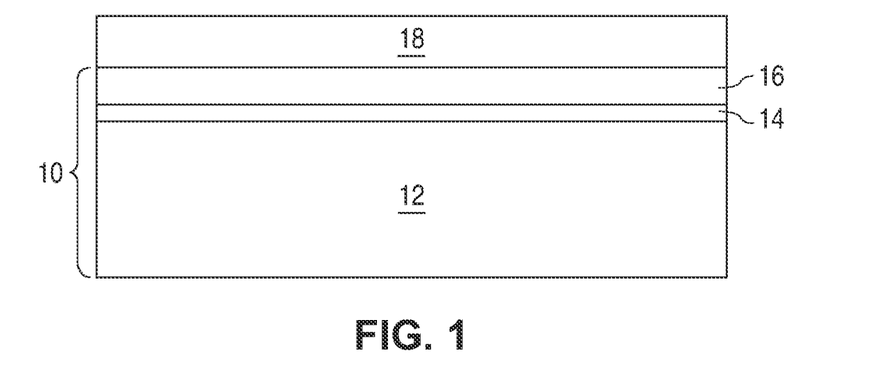
FIG. 1 illustrates a III-nitride semiconductor structure grown on a composite substrate.

Composite substrates are described in more detail in US Patent Application Publication 2007/0072324, titled "Substrate for Growing a III-V Light Emitting Device" and incorporated herein by reference. An example of a composite substrate is illustrated in FIG. 1. Substrate 10 includes a host substrate 12, a seed layer 16, and a bonding layer 14 that bonds host 12 to seed 16. Each of the layers in substrate 10 are formed from materials that can withstand the processing conditions required to grow the semiconductor layers in the device. For example, in the case of a III-nitride device grown by MOCVD, each of the layers in substrate 10 must be able to tolerate an $H_2$ ambient at temperatures in excess of 1000° C.; in the case of a III-nitride device grown by MBE, each of the layers in substrate 10 must be able to tolerate temperatures in excess of 600° C. in a vacuum.

Host substrate 12 provides mechanical support to substrate 10 and to the semiconductor device layers 18 grown over substrate 10. Host substrate 12 is generally between 3 and 500 microns thick and is often thicker than 100 microns. In embodiments where host substrate 12 remains part of the device, host substrate 12 may be at least partially transparent if light is extracted from the device through host substrate 12. Host substrate 12 generally does not need to be a single crystal material since device layers 18 are not grown directly on host substrate 12. In some embodiments, the material of host substrate 12 is selected to have a coefficient of thermal expansion (CTE) that matches the CTE of device layers 18 and the CTE of seed layer 16. Any material able to withstand the processing conditions of epitaxial layers 18 may be suitable in embodiments of the invention, including semiconductors, ceramics, and metals.

Seed layer 16 is the layer on which device layers 18 are grown, thus it must be a material on which III-nitride crystal can nucleate. Seed layer 16 may be between about 50 Å and 1 μm thick. A III-nitride seed layer may be, for example, between 50 and 200 nm thick, and is often between 75 and 125 nm thick. In some embodiments seed layer 16 is CTE-matched to the material of device layers 18. Seed layer 16 is generally a single crystal material that is a reasonably close lattice-match to device layers 18. Often the crystallographic orientation of the top surface of seed layer 16 on which device layers 18 are grown is the wurtzite [0001] c-axis. In embodiments where seed layer 16 remains part of the finished device, seed layer 16 may be transparent or thin if light is extracted from the device through seed layer 16.

One or more bonding layers 14 bond host substrate 12 to seed layer 16. Bonding layer 14 may be between about 100 Å and 1 µm thick. Examples of suitable bonding layers include glass such as borophosphorosilicate glass (BPSG), $SiO_x$ such as $SiO_2$, $SiN_x$ such as $Si_3N_4$, $HfO_2$, mixtures thereof, metals such as Mo, Ti, TiN, other alloys, and other semiconductors or dielectrics. Since bonding layer 14 connects host substrate 12 to seed layer 16, the material forming bonding layer 14 is selected to provide good adhesion between host 12 and seed 16. In some embodiments, bonding layer 14 is a release layer formed of a material that can be etched by an etch that does not attack device layers 18, thereby releasing device layers 18 and seed layer 16 from host substrate 12. For example, bonding layer 14 may be $SiO_2$ which may be wet-etched by HF without causing damage to III-nitride device layers 18. In embodiments where bonding layer 14 remains part of the finished device, bonding layer 14 is preferably transparent or very thin. In some embodiments, bonding layer 14 may be omitted, and seed layer 16 may be adhered directly to host substrate 12.

Device layers 18 are conventional III-nitride device layers grown by growth techniques known in the art. The composition of the layer adjacent to seed layer 16 may be chosen for its lattice constant or other properties, and/or for its ability to nucleate on the material of seed layer 16.

Epitaxial layers 18 grown over seed layer 16 are often strained due to the lattice-mismatch between epitaxial layers 18 and seed layer 16, thus to limit strain the composition of seed layer may be chosen to be reasonably lattice-matched to epitaxial layers 18. In addition, the composition of seed layer 16 and host substrate 12 may be selected to have CTEs that are close to the CTE of epitaxial layers 18. In some embodiments, the host substrate and seed layer materials are selected such that the CTE of the host is at least 90% of the CTE of at least one of the device layers, such as the light emitting layer. The composition of host substrate 12 is generally selected to have a CTE greater than that of epitaxial layers 18, such that epitaxial layers 18 are under compressive, rather than tensile, strain.

In some embodiments, the materials for seed layer 16 and the first epitaxial layer 18 grown over the seed layer are selected such that the difference between the lattice constant of seed layer 16 and the lattice constant of the first epitaxial layer grown on the seed layer is less than 1%. Limiting the difference between the lattice constants of the seed layer and the first-grown layer may reduce the amount of strain in the device, potentially reducing the number of dislocations formed in epitaxial layers 18 of the device. In some devices, the lattice constant in epitaxial layers 18 such as the first-grown layer may be greater than the lattice constant in seed layer 16 so the epitaxial layers are under compressive strain, not tensile strain.

In some embodiments, further strain relief in epitaxial layers 18 may be provided by forming the seed layer as stripes or a grid over bonding layer 14, rather than as a single uninterrupted layer. Alternatively, seed layer may be formed as a single uninterrupted layer, then removed in places, for example by forming trenches, to provide strain relief. A single uninterrupted seed layer 16 may be attached to host substrate 12 through bonding layer 14, then patterned by conventional lithography techniques to remove portions of the seed layer to form stripes. The edges of each of the seed layer stripes may provide additional strain relief by concentrating dislocations within epitaxial layers 18 at the edges of the stripes of seed layer. The composition of seed layer 16, bonding layer 14, and the nucleation layer may be selected such that the nucleation layer material nucleates preferentially on seed layer 16, not on the portions of bonding layer 14 exposed by the spaces between the portions of seed layer 16.

In some embodiments, such as those including III-nitride seed layer materials, the seed layer is grown strained on a growth substrate. When the seed layer 16 is connected to host substrate 12 and released from the growth substrate, if the connection between seed layer 16 and host substrate 16 is compliant, for example a compliant bonding layer 14, seed layer 16 may at least partially relax. Thus, though the seed layer is grown as a strained layer, the composition may be selected such that the lattice constant of the seed layer, after the seed layer is released from the growth substrate and relaxes, is reasonably close or matched to the lattice constant of the epitaxial layers 18 grown over the seed layer.

For example, when a III-nitride device is conventionally grown on $Al_2O_3$, the first layer grown on the substrate is generally a GaN buffer layer with an a-lattice constant of about 3.19 angstroms. The GaN buffer layer sets the lattice constant for all of the device layers grown over the buffer layer, including the light emitting layer which is often InGaN. Since relaxed, free standing InGaN has a larger a-lattice constant than GaN, the light emitting layer is strained when grown over a GaN buffer layer. In contrast, in embodiments of the invention, an InGaN seed layer may be grown strained on a conventional substrate, then bonded to a host and released from the growth substrate such that the InGaN seed layer at least partially relaxes. After relaxing, the InGaN seed layer has a larger a-lattice constant than GaN. As such, the a-lattice constant of the InGaN seed layer is a closer match than GaN to the a-lattice constant of a relaxed free standing layer of the same composition as the InGaN light emitting layer. The device layers grown over the InGaN seed layer, including the InGaN light emitting layer, will replicate the a-lattice constant of the InGaN seed layer, which is at least partially relaxed and therefore has an a-lattice constant greater than 3.19 angstroms. Accordingly, an InGaN light emitting layer with a relaxed InGaN seed layer a-lattice constant is less strained than an InGaN light emitting layer with a GaN buffer layer a-lattice constant. Reducing the strain in the light emitting layer may improve the performance of the device.

When the seed layer material is a III-nitride material grown strained on a growth substrate, a part of the composite substrate, often bonding layer 14, must act as a compliance layer that accommodates elastic relaxation of the III-nitride seed layer. The compliance layer can either be a solid with a sufficiently low stiffness that it can accommodate the relaxation of the III-nitride seed layer via its own elastic deformation, or a viscous material that can accommodate relaxation in the III-nitride seed layer via shear. In some embodiments, bonding layer 14 is BPSG, a type of glass that melts at a temperature below 700° C., and which has a viscosity which varies greatly with temperature. An InGaN seed layer 16, grown strained on a growth substrate, is bonded to a host substrate coated with BPSG at low temperature, where the BPSG is solid. The sapphire growth substrate of InGaN seed layer 16 is removed, for example by laser melting. The composite substrate is then annealed at a temperature at which the BPSG liquefies, thereby allowing the InGaN seed layer to relax.

The InGaN seed layer expands laterally, but can also relieve strain by buckling out of the plane of the substrate. Since buckling occurs everywhere in the InGaN seed layer at once and lateral relaxation must propagate inward from the edge of a relaxing film, seed layers with lateral dimensions larger than the buckling wavelength tend to buckle everywhere except at the edges.

III-nitride seed layer materials may require additional bonding steps in order to form a composite substrate with a III-nitride seed layer in a desired orientation. III-nitride layers grown on sapphire or SiC growth substrates are typically grown as c-plane wurtzite. Such wurtzite III-nitride structures have a gallium face and a nitrogen face. Conventional commercial, MOCVD-grown III-nitride materials preferentially grow such that the top surface of the grown layer is the gallium face, while the bottom surface (the surface adjacent to the growth substrate) is the nitrogen face. Simply growing seed layer material conventionally on sapphire or SiC then connecting the seed layer material to a host and removing the growth substrate would result in a composite substrate with a III-nitride seed layer with the nitrogen face exposed. As described above, III-nitrides preferentially grow on the gallium face, i.e. with the gallium face as the top surface. Conventional growth on the nitrogen face may undesirably introduce defects into the crystal, or result in poor quality material as the crystal orientation switches from an orientation with the nitrogen face as the top surface to an orientation with the gallium face as the top surface. Nitrogen face III-nitride structures may be grown by MBE or MOCVD with modified growth conditions, which may be costly and may complicate fabrication of a device.

To form a composite substrate with a III-nitride seed layer with the gallium face as the top surface, seed layer material may be grown conventionally on a growth substrate, bonded to any suitable first host substrate, then separated from the growth substrate, such that the seed layer material is bonded to the first host substrate through the gallium face, leaving the nitrogen face exposed by removal of the growth substrate. The nitrogen face of the seed layer material is then bonded to a second host substrate 10, the host substrate of the composite substrate according to embodiments of the invention. After bonding to the second host substrate, the first host substrate is removed by a technique appropriate to the growth substrate. In the final composite substrate, the nitrogen face of the seed layer material 16 is bonded to host substrate 12 (the second host substrate) through optional bonding layer 14, such that the gallium face of III-nitride seed layer 16 is exposed for growth of epitaxial layers 18.

For example, a GaN buffer layer is conventionally grown on a sapphire substrate, followed by an InGaN layer which will form the seed layer of a composite substrate. After growth, the InGaN layer may be patterned to form trenches, as described above. The patterned InGaN layer is bonded to a first host substrate with a BPSG bonding layer. The sapphire growth substrate is removed by laser melting of the GaN buffer layer adjacent to the sapphire, then the remaining GaN buffer layer exposed by removing the sapphire is removed by etching, resulting in an InGaN layer bonded to a first host substrate. The structure may be heated such that the viscosity of the BPSG layer is reduced and the InGaN layer at least partially relaxes. The InGaN layer may be implanted with a material such as hydrogen, deuterium, or helium at a depth corresponding to the desired thickness of the seed layer in the final composite substrate. The InGaN layer may optionally be processed to form a surface sufficiently flat for bonding. The InGaN layer is then bonded with or without a bonding layer (for example, with a $SiO_2$ bonding layer) to a second host substrate (for example, $Al_2O_3$), which will form the host in the final composite substrate. The first host substrate, InGaN layer, and second host substrate are then heated, which delaminates the thin seed layer portion of the InGaN layer from the rest of the InGaN layer and the first host substrate at the implanted depth, resulting in a finished composite substrate as described above with islands of InGaN seed material bonded to a host substrate. The InGaN surface resulting from delamination may be optionally processed to form a surface suitable for epitaxial growth. In some embodiments, the InGaN layer may be grown to the desired thickness, or may be etched to the desired thickness, eliminating the need for implantation steps.

As an alternative to bonding the seed layer material twice, to a first host substrate then to a second host substrate in order to twice flip the crystal orientation of the seed layer material, the seed layer material may be grown on a growth substrate with the nitrogen face up. When the nitrogen face seed layer material is connected to host substrate 12 as described above, the gallium face of seed layer 16 is exposed for growth of epitaxial layers 18. Nitrogen-face films may be grown by, for example, vapor phase epitaxy or MOCVD, as described in more detail in "Morphological and structure characteristics of homoepitaxial GaN grown by metalorganic chemical vapour deposition (MOCVD)," Journal of Crystal Growth 204 (1999) 419-428 and "Playing with Polarity", Phys. Stat. Sol. (b) 228, No. 2, 505-512 (2001), both of which are incorporated herein by reference.

In some embodiments, the seed layer material is grown as m-plane or a-plane material, rather than as c-plane material as described above. M-plane and r-plane III-nitride materials are non-polar orientations, i.e. they do not have a gallium face and a nitrogen face. Accordingly, non-polar seed layer orientations need not be bonded twice, as described above. A non-polar seed layer may be bonded twice, however, if the compliant material used to facilitate relaxation is not compatible with device growth, or to avoid processing the surface resulting from growth substrate removal to make the surface suitable for epitaxial growth.

Figure 2:
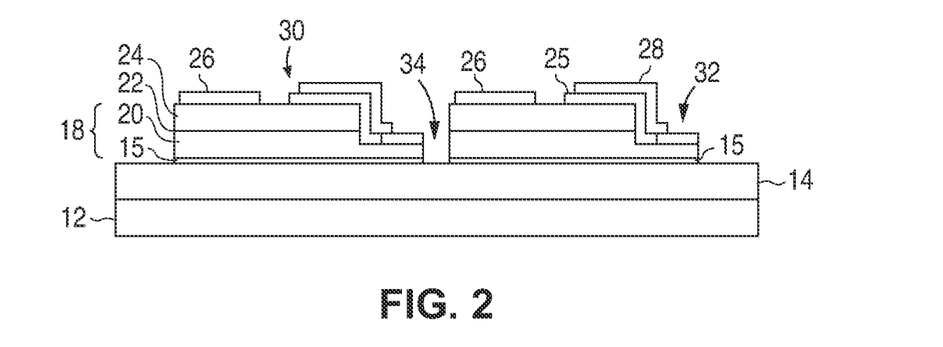
FIG. 2 is a cross sectional view of a portion of a III-nitride device including III-nitride semiconductor structures grown on islands of seed layer material on a composite substrate.
Figure 9:
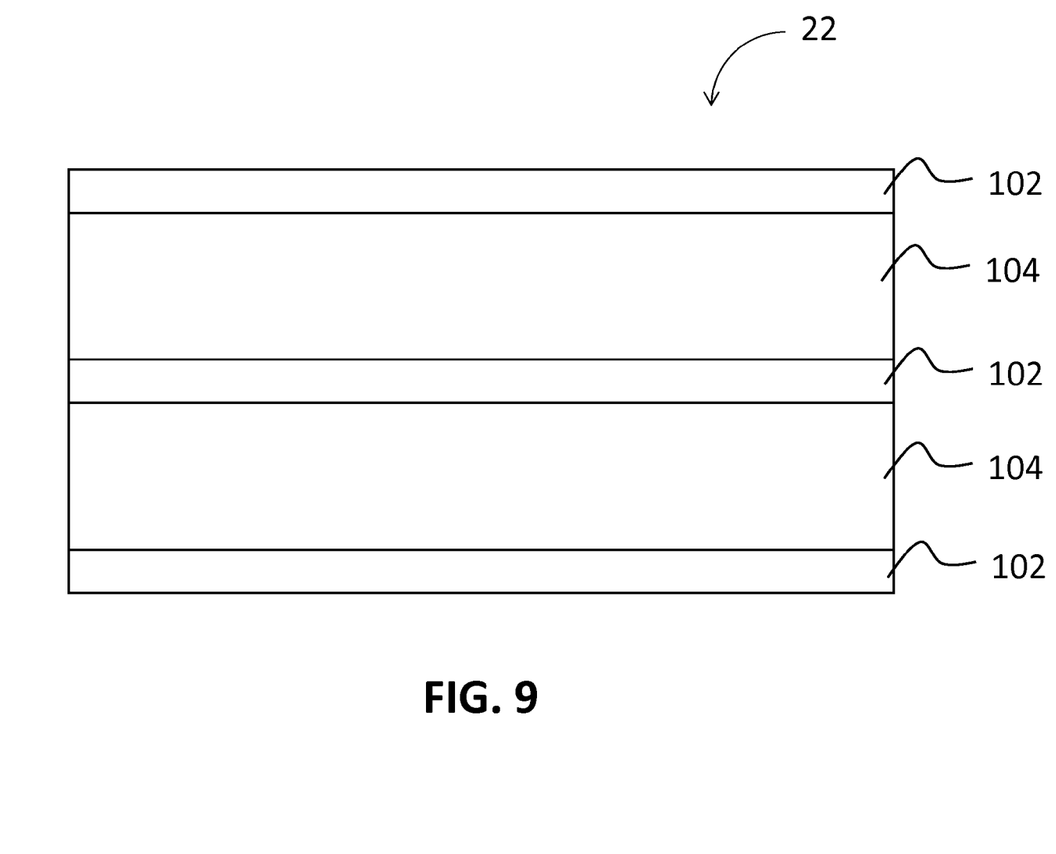
FIG. 9 illustrates a light emitting region including quantum wells separated by barrier layers.

FIG. 2 illustrates a portion of a device according to embodiments of the invention. In the device illustrated FIG. 2, a composite substrate includes islands of seed layer material 15 connected to host substrate 12 by compliance/bonding layer 14. Islands 30 of a III-nitride device structure 18 are grown over the islands of seed layer material under growth conditions that favor vertical rather than lateral growth, such that trenches 34 are maintained between the islands 30 of III-nitride material. Device layers 18 include an n-type region 20, a light emitting region 22, and a p-type region 24. Light emitting region 22 may include multiple quantum well light emitting layers 102 separated by barrier layers 104, as illustrated in FIG. 9. Device layers 18 may have a total thickness between one and five microns.

In a device emitting blue light, the seed layer may be, for example, $In_xGa_{1-x}N$ where x is between 0.03 and 0.07. N-type region 20 may include an $In_xGa_{1-x}N$ layer, where x is between 0.03 and 0.07, grown over the seed layer. Light emitting region 22 may include a single light emitting layer or a multi-quantum well light emitting region with multiple, thin quantum well light emitting layers and barrier layers disposed between adjacent quantum wells. The light emitting layers of light emitting region 22 may be $In_xGa_{1-x}N$ where x is between 0.16 and 0.18. P-type region 24 may include one or more $In_xGa_{1-x}N$ layers, where x is between 0.03 and 0.07.

In a device emitting cyan light, the seed layer may be, for example, $In_xGa_{1-x}N$ where x is between 0.08 and 0.13. N-type region 20 may include an $In_xGa_{1-x}N$ layer, where x is between 0.08 and 0.13, grown over the seed layer. Light emitting region 22 may include a single light emitting layer or a multi-quantum well light emitting region with multiple, thin quantum well light emitting layers and barrier layers disposed between adjacent quantum wells. The light emitting layers of light emitting region 22 may be $In_xGa_{1-x}N$ where x is between 0.19 and 0.22. P-type region 24 may include one or more $In_xGa_{1-x}N$ layers, where x is between 0.08 and 0.13.

In a device emitting green light, the seed layer may be, for example, $In_xGa_{1-x}N$ where x is between 0.1 and 0.16. N-type region 20 may include an $In_xGa_{1-x}N$ layer, where x is between 0.1 and 0.16, grown over the seed layer. Light emitting region 22 may include a single light emitting layer or a multi-quantum well light emitting region with multiple, thin quantum well light emitting layers and barrier layers disposed between adjacent quantum wells. The light emitting layers of light emitting region 22 may be $In_xGa_{1-x}N$ where x is between 0.23 and 0.25. P-type region 24 may include one or more $In_xGa_{1-x}N$ layers, where x is between 0.1 and 0.16.

Appropriate size for islands 30 is dictated by several factors. First, in some embodiments, the InGaN seed layer may be patterned into islands that are smaller than the buckling wavelength (described above), which may be, for example, on the order of a few microns. Second, processing time and conditions may favor smaller islands. For example, larger islands require more time to relax laterally to relieve buckles that may have formed in the center of the island. In addition, the anneal temperature needed to achieve acceptable flattening of the buckles may cause degradation of the seed layer material over time. Smaller islands require shorter annealing times, which limit the amount of degradation. Third, as buckles grown in size, the adhesion between the compliance layer and the seed layer material may begin to fail. Limiting the size of the islands allows lateral expansion of the island to reach the center of the island to reduce the buckle size before the buckles grow large enough to separate from the compliance layer. Fourth, large buckles may be difficult to flatten from lateral relaxation. As described above, limiting the size of the islands may reduce the size of buckles in the seed layer material.

Figure 3:
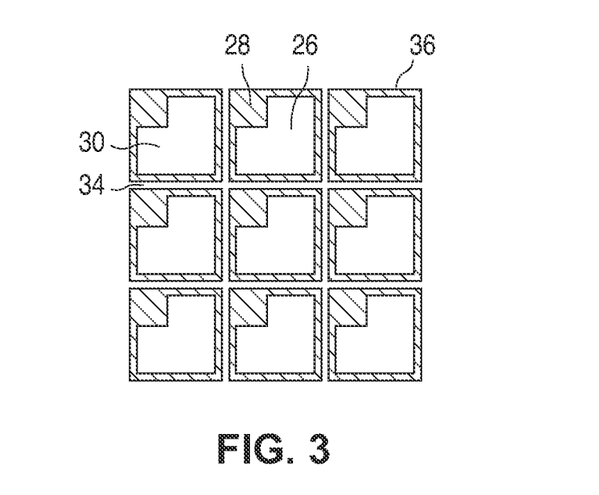
FIG. 3 is a plan view of a top surface of a portion of a device illustrated in cross section in FIG. 2.

Each island 30 may be arbitrarily large or small, but islands 30 typically are between tens of microns and a few millimeters in length. In some embodiments, islands 30 are between 50 and 500 microns in length; in some embodiments, islands 30 are between 100 and 300 microns in length. For example, each island may have an area between 100 microns by 100 microns and 300 microns by 300 microns. Though square islands 30 are illustrated in FIG. 3, islands 30 may be any shape. To form a device with on the order of 1 $mm^2$ of active region area, 100 islands each with an area of 100 microns by 100 microns may be formed. Accordingly, though the examples below illustrate just a few islands, it is to be understood that a single device may have many islands, for example between 10 and 200 islands. The trenches separating neighboring islands may be arbitrarily large and as small as the techniques used to form the islands permit. In some embodiments, the trenches are between 5 and 50 microns wide; in some embodiments, the trenches are between 20 and 30 microns wide.

In the device illustrated in FIG. 2, on each island 30, a portion of p-type region 24 and light emitting region 22 is etched away to reveal a portion of n-type region 20. A p-contact 26 is formed on the remaining portion of p-type region 24. An n-contact 28 is formed on the exposed portion of n-type region 20. In the structure illustrated in FIG. 2, the area where n-contact 28 contacts n-type region 20 is narrow, for example between one and five microns wide, and n-contact 28 extends over the top of p-type region 24. A dielectric material 25 such as an oxide of silicon or a nitride of silicon may provide electrical isolation between the p-type and light emitting regions of semiconductor structure and n-contact 28.

FIG. 3 is a plan view of a top surface of a structure including nine islands 30 such as the islands illustrated in cross section in FIG. 2. The area of p-contact 26 may be larger than the area of n-contact 28, since current spreads more readily in n-type III-nitride material than in p-type III-nitride material. An n-contact ring 36, not shown in FIG. 2, may be formed around the edge of each island.

Figure 4:
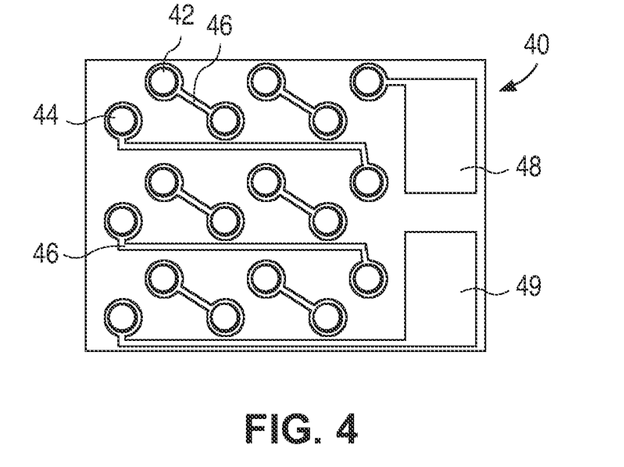
FIG. 4 is a plan view of a top surface of a mount on which the structure illustrated in FIG. 3 may be mounted.

FIG. 4 is a plan view of a top surface of a mount on which the structure of FIG. 3 may be mounted such that the surface illustrated in FIG. 3 connects to the surface illustrated in FIG. 4. N-contacts 28 on the islands illustrated in FIG. 3 are connected to n-contact pads 42 on the mount illustrated in FIG. 4. P-contacts 26 are connected to p-contact pads 44. Electrical connections 46 between adjacent islands are formed on mount 40, rather than on the semiconductor structure illustrated in FIG. 3. Current is supplied to the structure by contact pads 48 and 49. In the structure illustrated in FIG. 4, islands 30 of FIG. 3 are connected in series. Other electrical arrangements between the islands are possible and are within the scope of the invention. After mounting the structure of FIG. 3 on the mount of FIG. 4, the composite substrate may be optionally removed by a technique appropriate to the substrate, such as etching or grinding.

The structure illustrated in FIGS. 2-4 may be fabricated and mounted such that light is extracted from the device through the composite substrate (shown in FIG. 2 as bonding layer 14 and host substrate 12), or through a surface of n-type region 20 if the composite substrate is removed. In such devices, p- and n-contacts 26 and 28 may be reflective. In some embodiments, the structure illustrated in FIGS. 2-4 may be mounted such that light is extracted from the device through mount 40. In such devices, p- and n-contacts 26 and 28 may be transparent. In addition, mount 40, n- and p-contact pads 42 and 44, and electrical connections 46 may be transparent, or formed to absorb as little light as possible. For example, if mount 40 may be kept thin. Absorbing n- and p-contact pads 42 and 44 and electrically connections 46 may be made as small as possible, to reduce the amount of light absorbed. In one example of such a device, mount 40 is a ceramic including a wavelength converting material such as a phosphor, described in more detail in U.S. Pat. No. 7,361,938, which is incorporated herein by reference. N- and p-contact pads 42 and 44 and electrical connections 46 may be a transparent, conductive oxide such as indium tin oxide.

Figure 5:
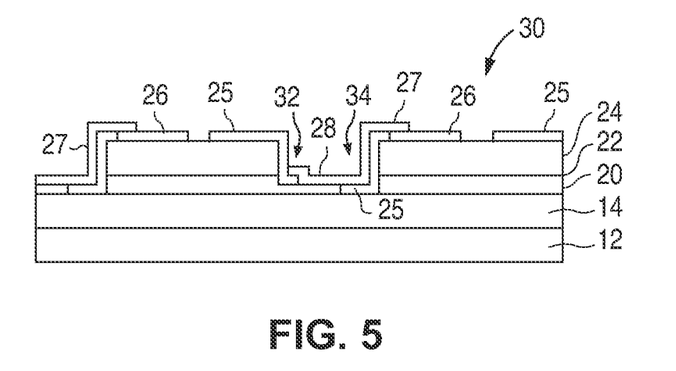
FIG. 5 is a cross sectional view of a portion of a III-nitride device including III-nitride semiconductor structures grown on islands of seed layer material on a composite substrate, including electrical connections between adjacent islands.

FIG. 5 illustrates a device where interconnects between islands are formed on the semiconductor structure, rather than on a mount as shown in FIG. 4. In the device illustrated in FIG. 5, as in the device illustrated in FIG. 2, on each island, a portion of p-type region 24 and light emitting region 22 are etched away to reveal a portion of n-type region 20 on which n-contact 28 is formed. Interconnects formed on the III-nitride semiconductor structures electrically connect individual islands 30. Specifically, a conductive interconnect 27, usually metal, connects n-contact 28 to the p-contact 26 of the adjacent island 30. Electrical isolation is provided, where appropriate, by dielectric layers 25, which may be, for example, nitrides of silicon or oxides of silicon. The two islands illustrated in FIG. 5 are connected in series. Other electrical arrangements between the islands are possible and are within the scope of the invention. The interconnects between islands can be formed by conventional wafer-level lithographic processes.

Forming the interconnects on the III-nitride structure, as illustrated in FIG. 5, complicates the lithographic process, since a separate lithographic mask design is required for every interconnect permutation, but simplifies and standardizes the design of the mount on which the structure is mounted. In contrast, forming the interconnects on the mount, as illustrated in FIGS. 2-4, simplifies and standardizes the lithographic process required to form the III-nitride structure illustrated in FIG. 2, but complicates the design and lithographic processes required to form the mount illustrated in FIG. 4.

Figure 6:
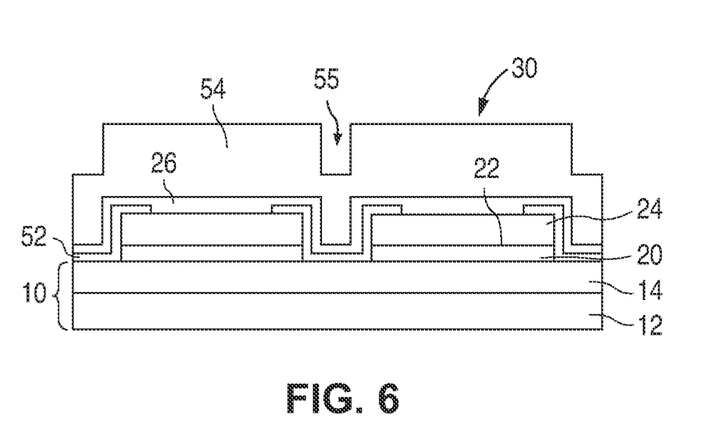
FIG. 6 illustrates forming a thick metal over the p-contacts formed on a device including III-nitride semiconductor structures grown on islands of seed layer material on a composite substrate.
Figure 7:
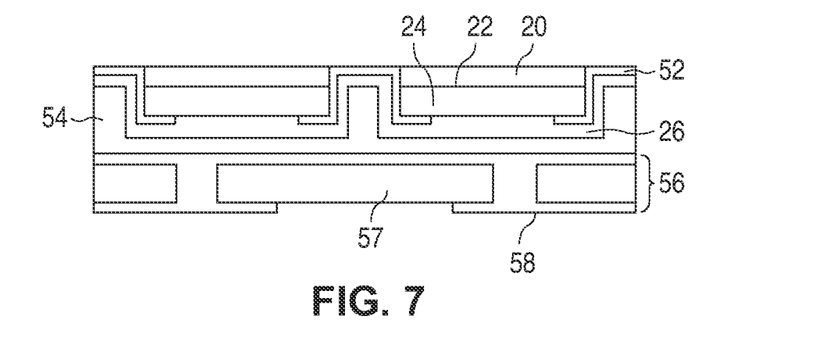
FIG. 7 illustrates the structure of FIG. 6 after planarizing the thick metal layer, bonding the structure to a mount, and removing the composite substrate.
Figure 8:
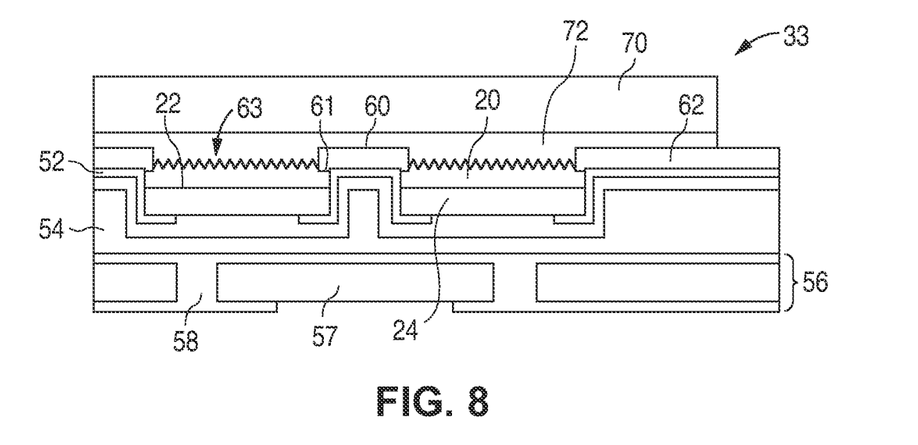
FIG. 8 illustrates the structure of FIG. 7 after texturing the surface exposed by removing the composite substrate and forming n-contacts.

FIGS. 6, 7, and 8 illustrate the fabrication of a structure which does not require etching a mesa to expose the n-type region, according to embodiments of the invention. In FIG. 6, n-type region 20, light emitting region 22, and p-type region 24 are grown in islands 30 over a composite substrate, as described above. A dielectric 52 is formed which electrically isolates adjacent islands 30. Openings in dielectric 52 permit p-contacts 26 to be formed on a portion of p-type region 24 on each island. A thick ohmic metal layer 54 is then formed over p-contacts 26 by any suitable process such as electroplating.

In FIG. 7, thick metal layer 54 is planarized for example by electrochemical or mechanical polishing, to form a flat surface which is then connected to mount 56. Mount 56 is usually electrically and thermally conductive. For example, mount 56 may be a metal wafer, a semiconductor wafer with ohmic metal contacts on the top and bottom, or, as illustrated in FIG. 7, an electrically insulating wafer 57, such as sintered AlN, with metal-filled vias 58 connecting ohmic metal contacts on the top and bottom. The III-nitride structure may be connected to mount 56 by any suitable technique including, for example, soldering or thermosonic bonding. Composite substrate 10, shown in FIG. 6, is then removed by any suitable technique including, for example, mechanical grinding, chemical etching, laser lift-off, or etching of a sacrificial epitaxial layer. Removing composite substrate 10 exposes n-type region 20.

In FIG. 8, the surface of n-type region 20 is planarized by, for example, mechanical polishing or wet or dry etching. The planarized surface of n-type region 20 may be optionally roughened or patterned, for example, by etching or mechanical or electrochemical roughening, to improve light extract from the device. N-contacts 60 are formed over the trenches between the islands, where there is no light emitting region, such that n-contacts 60 do not absorb a significant amount of emitted light. N-contacts 60 electrically connect to n-type region 20 at edges 61. For example, edges 61 may be between one and five microns wide. An optional electrically conductive but optically transparent film (not shown in FIG. 8) may be formed over the exposed portions of n-type region 20, to improve current spreading in n-type region 20 from n-contact 60. Examples of suitable materials include transparent conductive oxides like indium tin oxide or tin oxide and wide bandgap semiconductors such as zinc oxide or indium aluminum nitride.

In some embodiments, a wavelength converting material such as a ceramic or powder phosphor, and/or secondary optics known in the art such as a dichroic filter, are formed over n-type region 20. For example, a ceramic phosphor 70, as described above, may be positioned above n-type region 20, in the path of light extracted from the device. A transparent conductive material 72 such as, for example, a transparent conductive oxide such as indium tin oxide, may be formed on the ceramic phosphor in contact with any or all of n-type regions 20 and n-contacts 60 and 62, to improve current spreading in the n-type region 20 between n-contacts 60 and 62. In some embodiments, one or more wide trenches 33 are formed in the composite substrate. The n-contacts 62 formed over these wide trenches may serve as a bonding pad. Spacing bonding pad 62 periodically, rather than having every n-contact 60 act as a bonding pad, may simplify the formation and placement of a wavelength converting layer or secondary optics such as, for example, a sintered ceramic phosphor wafer.

In some embodiments, thick metal 54 of FIG. 6 is thinned such that the spaces 55 between islands 30 are maintained. Instead of a single, continuous electrical contact 54 between p-type regions 24 and mount 56 as illustrated in FIGS. 7 and 8, individual islands may be electrically connected to a mount through electrically isolated bond pads. In some embodiments, the connections between p-type regions 24 and mount 56 are not conductive. In such embodiments, vias may be etched through the semiconductor structure to make electrical contact to the buried p-type region.

A wavelength converting material such as a phosphor may be placed in the path of light extracted from any of the embodiments and examples described above. For example, a single phosphor that emits yellow light, or multiple phosphors that emit red and green or yellow light, may be combined with a device that emits blue light. The combined light from the device and the phosphor(s) appears white. Other structures such as polarizers or filters may be placed in the path of light extracted from any of the embodiments and examples described above, in addition to or in place of the wavelength converting material(s) described above.

Devices including many islands of III-nitride material may have advantages over monolithic devices of the same area. Devices according to embodiments of the invention have an arbitrary aggregate area. Current density, drive current, and forward voltage can be at least partially decoupled. For example, individual islands on a device can be connected in a combination of series and parallel connections, which may allow the device to be driven at higher voltage and lower total current, at the same current density as a monolithic device. Finally, the islands can be connected in series, such that the drive current is decreased and the forward voltage increased by a factor of N, where N is the total number of islands, as compared with a monolithic device of the same area. Since lower current/higher voltage current regulators are typically cheaper than higher current/lower voltage current regulators, the total system cost of a device with islands may be less than a monolithic device of equivalent area.

Having described the invention in detail, those skilled in the art will appreciate that, given the present disclosure, modifications may be made to the invention without departing from the spirit of the inventive concept described herein. Elements from different examples and embodiments may be combined. For example, in some embodiments, some interconnects between islands are formed on the semiconductor structure, and some interconnects are formed on the mount. Therefore, it is not intended that the scope of the invention be limited to the specific embodiments illustrated and described.

What is being claimed is:

1. A method comprising: growing a plurality of III-nitride semiconductor structures on a substrate, wherein: each semiconductor structure comprises a light emitting region disposed between an n-type region and a p-type region, wherein the light emitting region comprises a first quantum well, a second quantum well, and a barrier disposed between the first and second quantum wells: the substrate comprises a host, a plurality of islands of III-nitride material separated by trenches, wherein the trenches extend through an entire thickness of III-nitride material that forms the semiconductor structures, and a bonding layer disposed between the host and the plurality of islands of III-nitride material, the bonding layer comprising one of glass, borophosphosilicate glass, $SiO_x$, $SiO_2$, $SiN_x$, $Si_3N_4$, $HfO_2$, Mo, Ti, TiN, and dielectric;

and the light emitting region of each semiconductor structure has an a-lattice constant greater than 3.19 angstroms; forming a conductive material that electrically connects two of the III-nitride semiconductor structures; and after growing the plurality of III-nitride semiconductor structures on the substrate, removing the host.

2. The method of claim 1 wherein forming a conductive material comprises forming a metal layer on at least a portion of the two connected III-nitride semiconductor structures.

3. The method of claim 2 wherein the metal layer electrically connects the p-type regions of the two III-nitride semiconductor structures.

4. The method of claim 2 wherein the metal layer electrically connects the p-type region of one of the two III-nitride semiconductor structures to the n-type region of the other of the two III-nitride semiconductor structures.

5. The method of claim 1 wherein forming a conductive material comprises forming a metal layer on a mount and connecting the plurality of III-nitride semiconductor structures to the mount such that the metal layer electrically connects two III-nitride semiconductor structures.

6. The method of claim 5 wherein removing the host occurs after connecting the plurality of III-nitride semiconductor structures to the mount.

7. The method of claim 1 wherein each III-nitride semiconductor structure has a length less than 500 microns.

8. The method of claim 1 wherein each trench has a width between 5 and 50 microns.

9. The method of claim 1 wherein an a-lattice constant of the light emitting layer of each semiconductor structure as grown in the device is greater than 3.19 angstroms.

10. A structure comprising: a plurality of III-nitride semiconductor structures connected to a mount, wherein: each semiconductor structure comprises a light emitting region disposed between an n-type region and a p-type region, wherein the light emitting region in each III-nitride semiconductor structure is a continuous region that is as wide as the p-type region: wherein the light emitting region comprises a first quantum well, a second quantum well, and a barrier disposed between the first and second quantum wells: adjacent semiconductor structures are separated by trenches, wherein the trenches extend through an entire thickness of the semiconductor structure; and an a-lattice constant of the light emitting region of each semiconductor structure as grown in the device is greater than 3.19 angstroms; and a conductive material disposed between two of the semiconductor structures, wherein the conductive material electrically connects two of the III-nitride semiconductor structures.

11. The structure of claim 10 wherein the conductive material comprises a metal layer disposed on at least a portion of the two connected III-nitride semiconductor structures.

12. The structure of claim 11 wherein the metal layer electrically connects the p-type regions of the two III-nitride semiconductor structures.

13. The structure of claim 11 wherein the metal layer electrically connects the p-type region of one of the two III-nitride semiconductor structures to the n-type region of the other of the two III-nitride semiconductor structures.

14. The structure of claim 10 wherein the conductive material comprises a metal layer disposed on the mount, wherein the metal layer connects the plurality of III-nitride semiconductor structures to the mount such that the metal layer electrically connects two III-nitride semiconductor structures.

15. The structure of claim 10 wherein:
the conductive material comprises a conductive oxide disposed on the mount; and
the mount comprises a ceramic material adapted to absorb first light emitted by the light emitting layer and emit second light having a different peak wavelength than the first light.

16. The structure of claim 10 wherein each III-nitride semiconductor structure has a length less than 500 microns.

17. The structure of claim 10 wherein each trench has a width between 5 and 50 microns.

18. A structure comprising:
a plurality of III-nitride semiconductor structures connected to a mount, wherein:
each semiconductor structure comprises a light emitting layer disposed between an n-type region and a p-type region;
adjacent semiconductor structures are separated by trenches, wherein the trenches extend through an entire thickness of the semiconductor structure; and
an a-lattice constant of the light emitting layer of each semiconductor structure as grown in the device is greater than 3.19 angstroms;
a conductive material disposed between two of the semiconductor structures, wherein the conductive material electrically connects two of the III-nitride semiconductor structures;
a ceramic material adapted to absorb first light emitted by the light emitting layer and emit second light having a different peak wavelength than the first light, wherein the ceramic material is disposed on a side of the plurality of semiconductor structures opposite the mount; and
a conductive oxide disposed between the plurality of semiconductor structures and the ceramic material.

* * * * *